(12) United States Patent
Geng et al.

(10) Patent No.: US 12,453,054 B2
(45) Date of Patent: Oct. 21, 2025

(54) COOLING ASSEMBLY WITH STRAP ELEMENT TO DIMINISH LATERAL MOVEMENT OF COOLING MASS DURING INSTALLATION OF THE COOLING MASS

(71) Applicant: Intel Corporation, Santa Clara, CA (US)

(72) Inventors: Phil Geng, Washougal, WA (US);
Ralph V. Miele, Hillsboro, OR (US);
David Shia, Portland, OR (US);
Sandeep Ahuja, Portland, OR (US);
Jeffory L. Smalley, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 17/676,100

(22) Filed: Feb. 18, 2022

(65) Prior Publication Data
US 2022/0174843 A1    Jun. 2, 2022

(51) Int. Cl.
*H05K 7/20*    (2006.01)
*H05K 7/14*    (2006.01)

(52) U.S. Cl.
CPC ....... *H05K 7/20409* (2013.01); *H05K 7/1489* (2013.01); *H05K 7/20727* (2013.01)

(58) Field of Classification Search
CPC ......... H01L 23/4006; H01L 2023/4087; H01L 23/4093; H01L 2023/4081; H01L 2023/405; H01L 23/3672; H01L 23/40; H01L 2924/15311; H01L 2023/4062; H01L 23/538; H01L 23/49833; G06F 1/183; G06F 1/184; G06F 1/20; H05K 1/0203;

(Continued)

(56) References Cited

U.S. PATENT DOCUMENTS 6,475,011 B1 *  11/2002  Sinha .............. H05K 3/325
                                                  439/330
6,552,905 B2 *  4/2003   Herring ............ H01L 23/4006
                                                  165/185

(Continued)

FOREIGN PATENT DOCUMENTS

GB         2576032 B      4/2021
GB         2576030 B      12/2021

(Continued)

OTHER PUBLICATIONS

Geng, Phil, "Structural Design of Land Grid Array Loading Mechanisms for Intel Central Processor Unit Stack Retention", Journal of Electronic Packaging, Mar. 2019, 8 pages, vol. 141 / 010801-1-010801-8, ASME, published online.

*Primary Examiner* — Michael A Matey
(74) *Attorney, Agent, or Firm* — Hanley, Flight & Zimmerman, LLC

(57) ABSTRACT

An apparatus is described. The apparatus includes a bolster plate having a first fixturing element and a strap. The strap is positioned along a frame arm of the bolster plate. The strap has a second fixturing element to be fixed to a cooling mass. The strap is to diminish movement of the cooling mass along the frame arm's dimension and a dimension that is orthogonal to the frame arm's dimension. A semiconductor chip package is to be placed in a window opening formed by the bolster plate's frame arms. The cooling mass is to be thermally coupled to the semiconductor chip package.

20 Claims, 16 Drawing Sheets

(58) Field of Classification Search
CPC ........... H05K 7/2039; H05K 2201/066; H05K 2201/10409; H05K 2201/10734; H05K 2201/2018; H05K 3/303; H05K 7/1069; H05K 7/1431; H05K 7/2049; H05K 7/20409; H05K 7/1489; H05K 7/20727; Y10T 24/44556; Y10T 24/44923; H01R 12/7047

See application file for complete search history.

(56) References Cited

U.S. PATENT DOCUMENTS

| | | | | |
|---|---|---|---|---|
| 7,095,614 | B2* | 8/2006 | Goldmann | H01L 23/4006 165/185 |
| 2002/0044424 | A1* | 4/2002 | Hashimoto | H01L 21/4878 361/709 |
| 2002/0137369 | A1* | 9/2002 | Edwards | H05K 7/1061 439/77 |
| 2003/0058624 | A1* | 3/2003 | Deeney | H05K 3/325 361/736 |
| 2005/0068741 | A1* | 3/2005 | Bailey | H01L 23/4006 257/E23.09 |
| 2005/0205989 | A1* | 9/2005 | Shibuya | H01L 23/3735 257/E23.106 |
| 2006/0087014 | A1* | 4/2006 | Rubenstein | H01L 23/4006 257/E23.084 |
| 2010/0302725 | A1* | 12/2010 | Busch | F28D 15/0233 29/525 |
| 2014/0161558 | A1* | 6/2014 | Hayashi | H01L 23/4006 411/366.1 |
| 2016/0079150 | A1* | 3/2016 | Chawla | H01L 23/433 165/185 |
| 2017/0231113 | A1* | 8/2017 | Anderl | G06F 1/20 |
| 2017/0371384 | A1* | 12/2017 | Ingalls | G06F 1/20 |
| 2018/0252483 | A1* | 9/2018 | Geng | H01L 23/427 |
| 2019/0393631 | A1* | 12/2019 | Haswarey | G06F 1/20 |
| 2020/0335432 | A1* | 10/2020 | Murtagian | H01L 21/67144 |
| 2021/0193558 | A1* | 6/2021 | Miele | G06F 1/183 |
| 2021/0305119 | A1* | 9/2021 | Mallik | H01L 23/5385 |
| 2021/0307153 | A1* | 9/2021 | Mohammad | H05K 7/1061 |
| 2021/0320050 | A1 | 10/2021 | Robinson et al. | |
| 2021/0378099 | A1* | 12/2021 | Geng | H01L 23/40 |
| 2022/0208645 | A1* | 6/2022 | Elenitoba-Johnson | H01L 23/4006 |

FOREIGN PATENT DOCUMENTS

| | | |
|---|---|---|
| GB | 2597525 A | 2/2022 |
| GB | 2601357 A | 6/2022 |

* cited by examiner

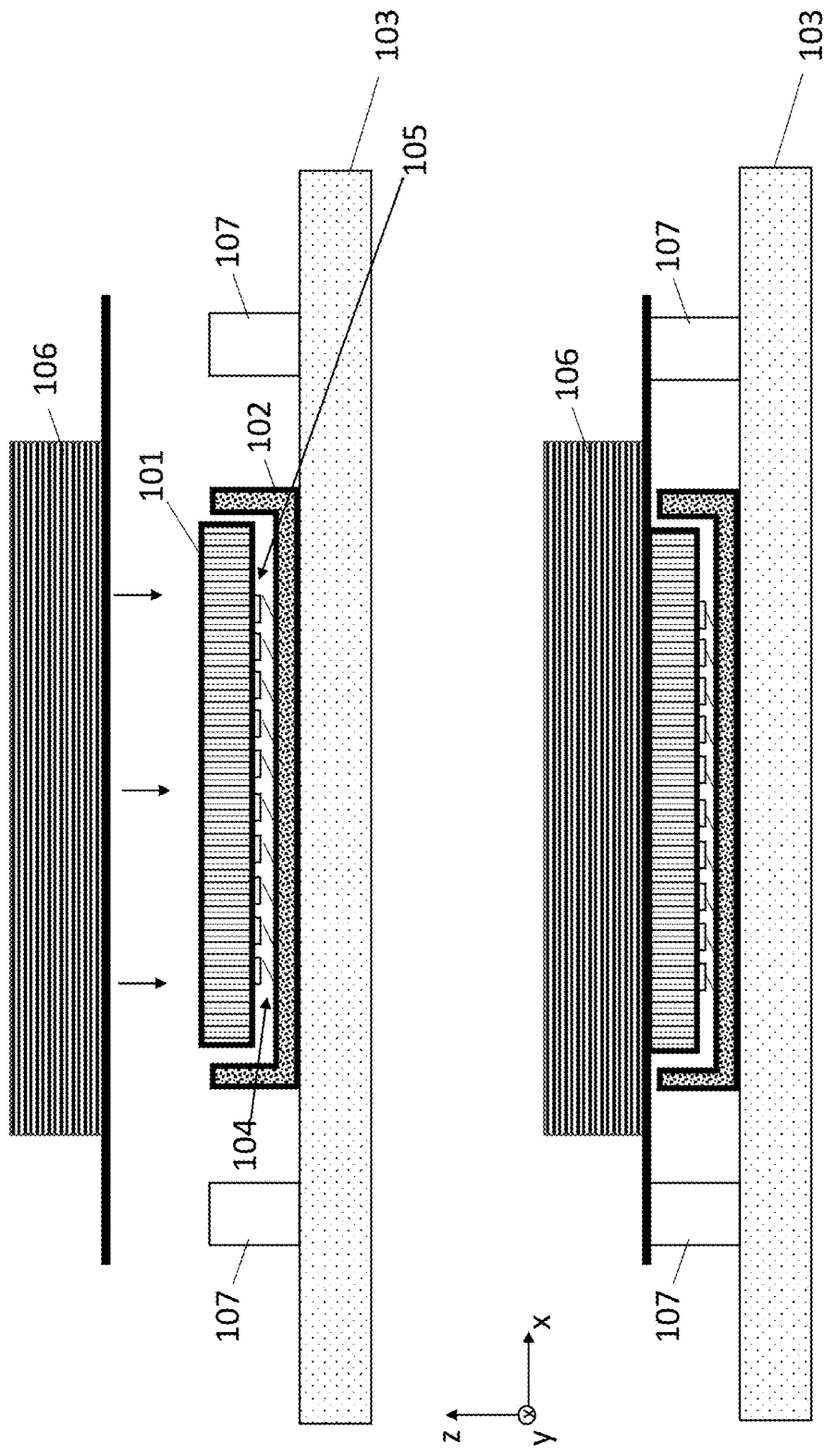

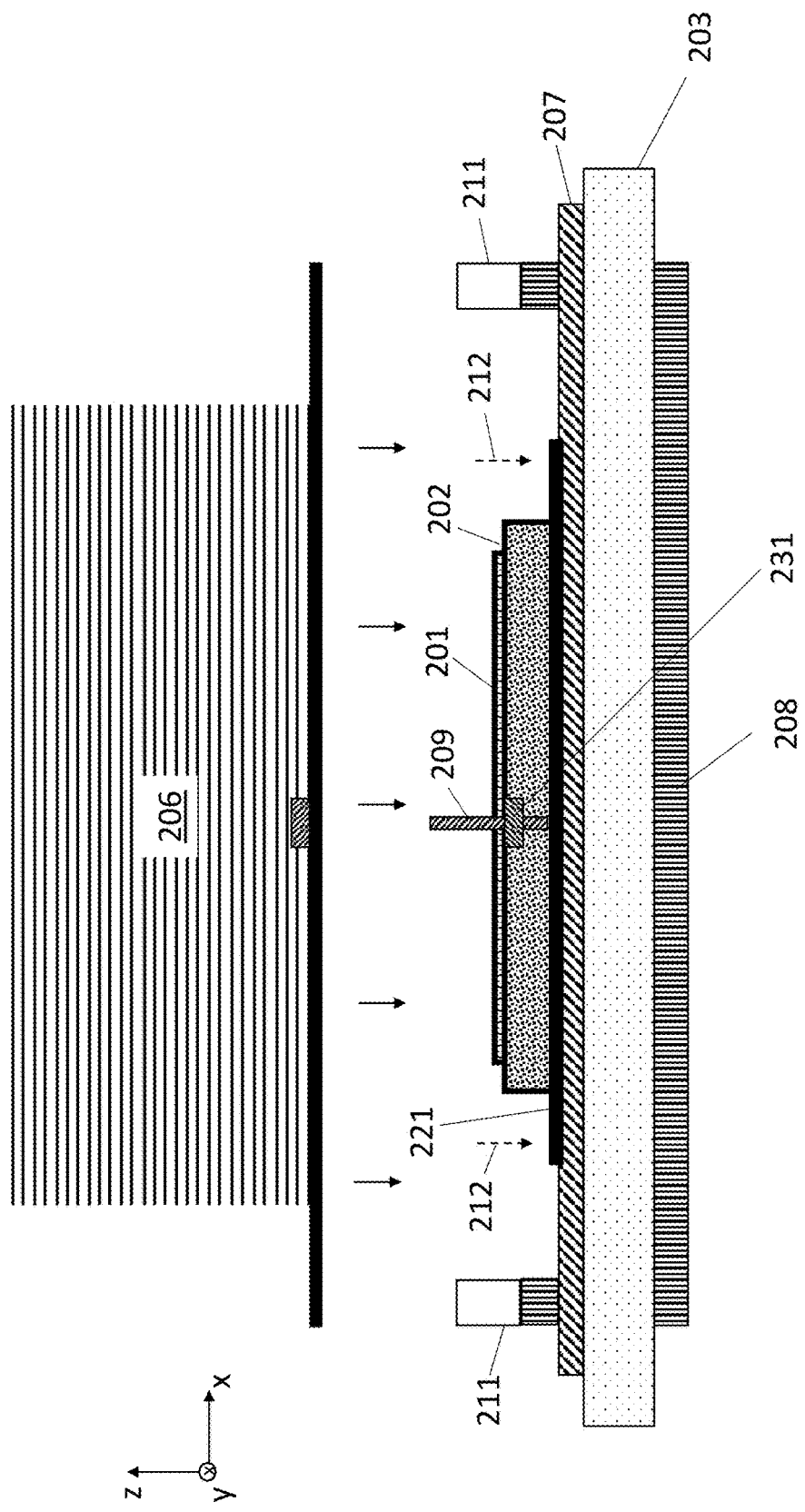

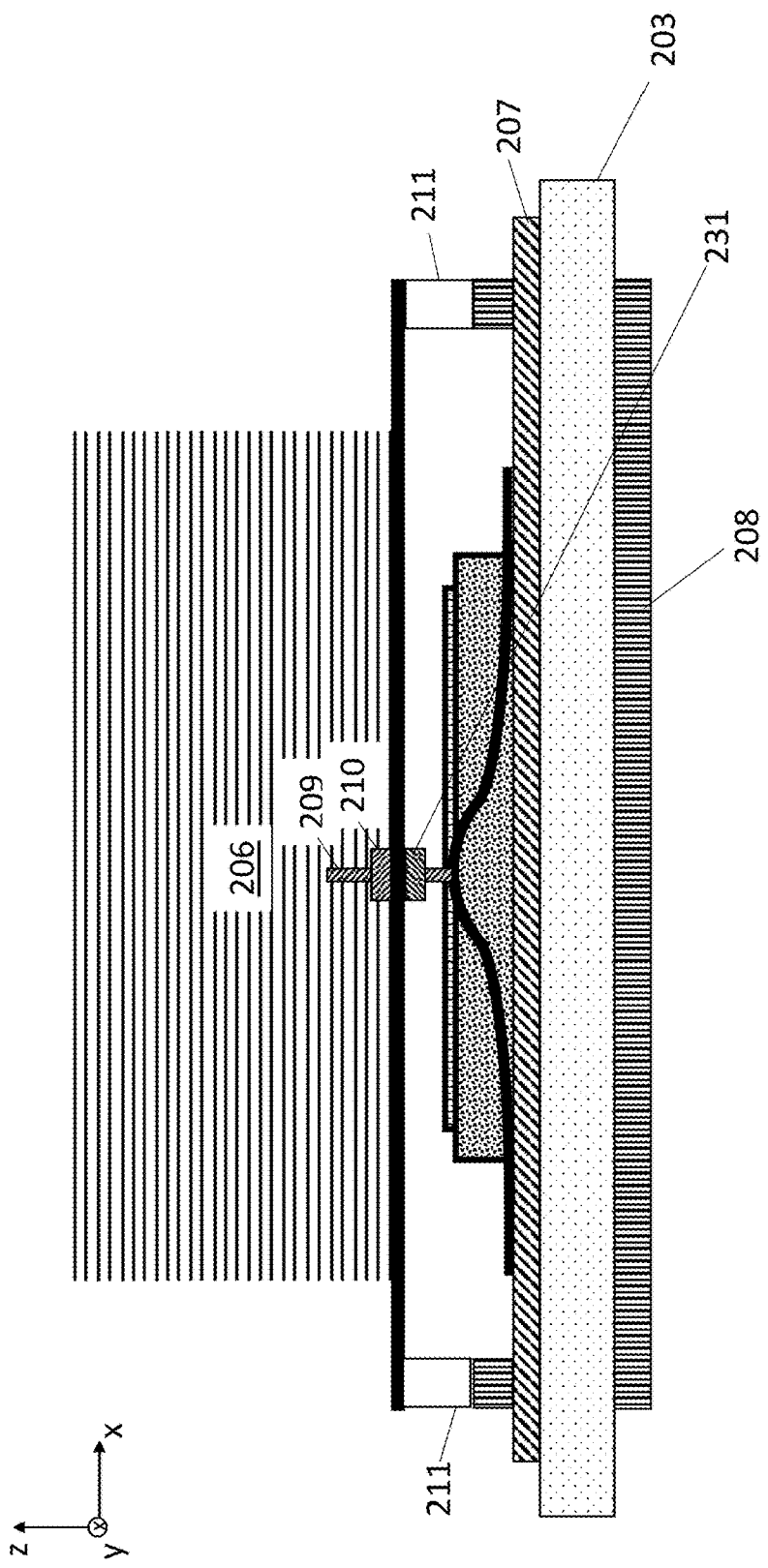

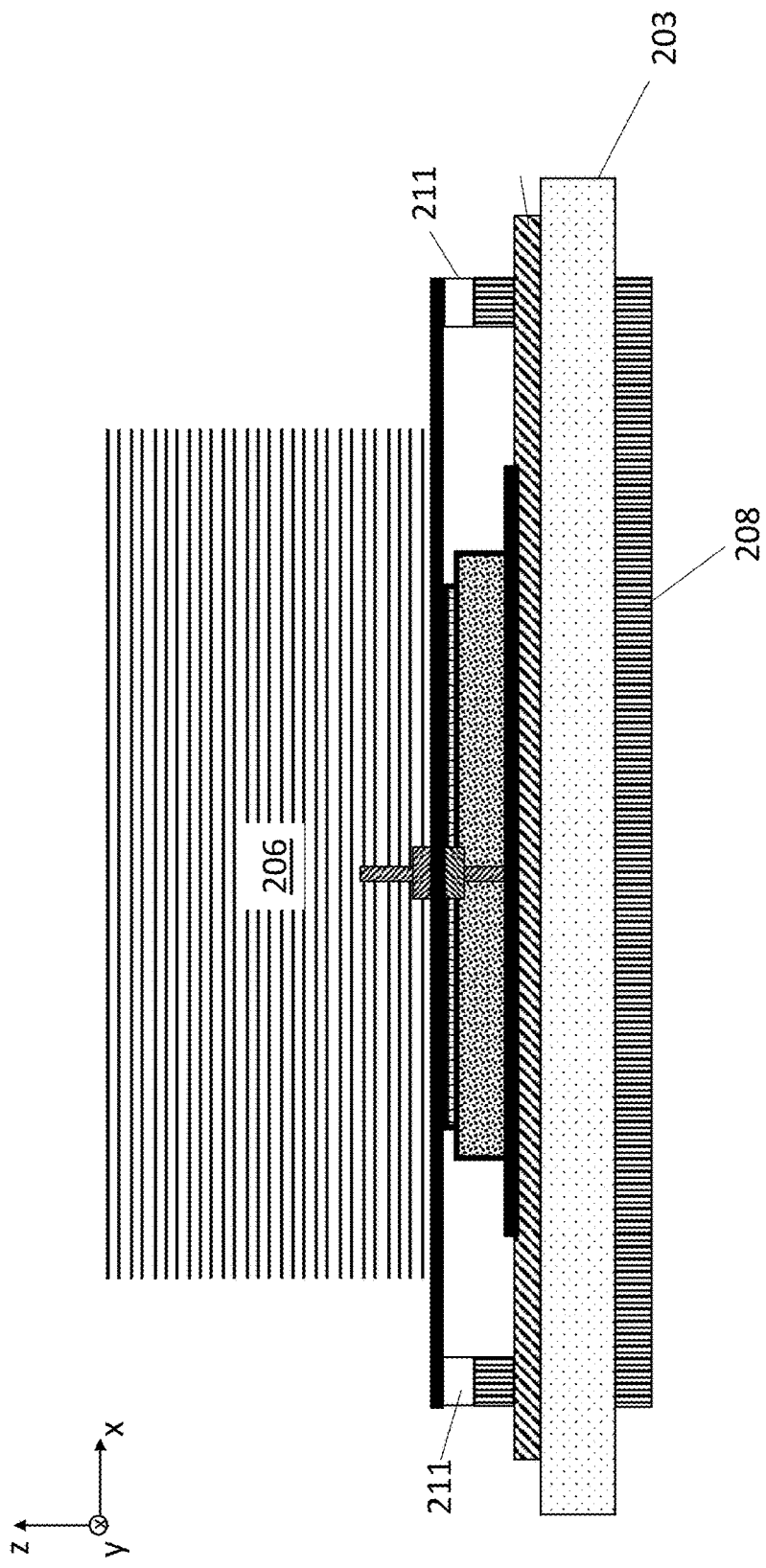

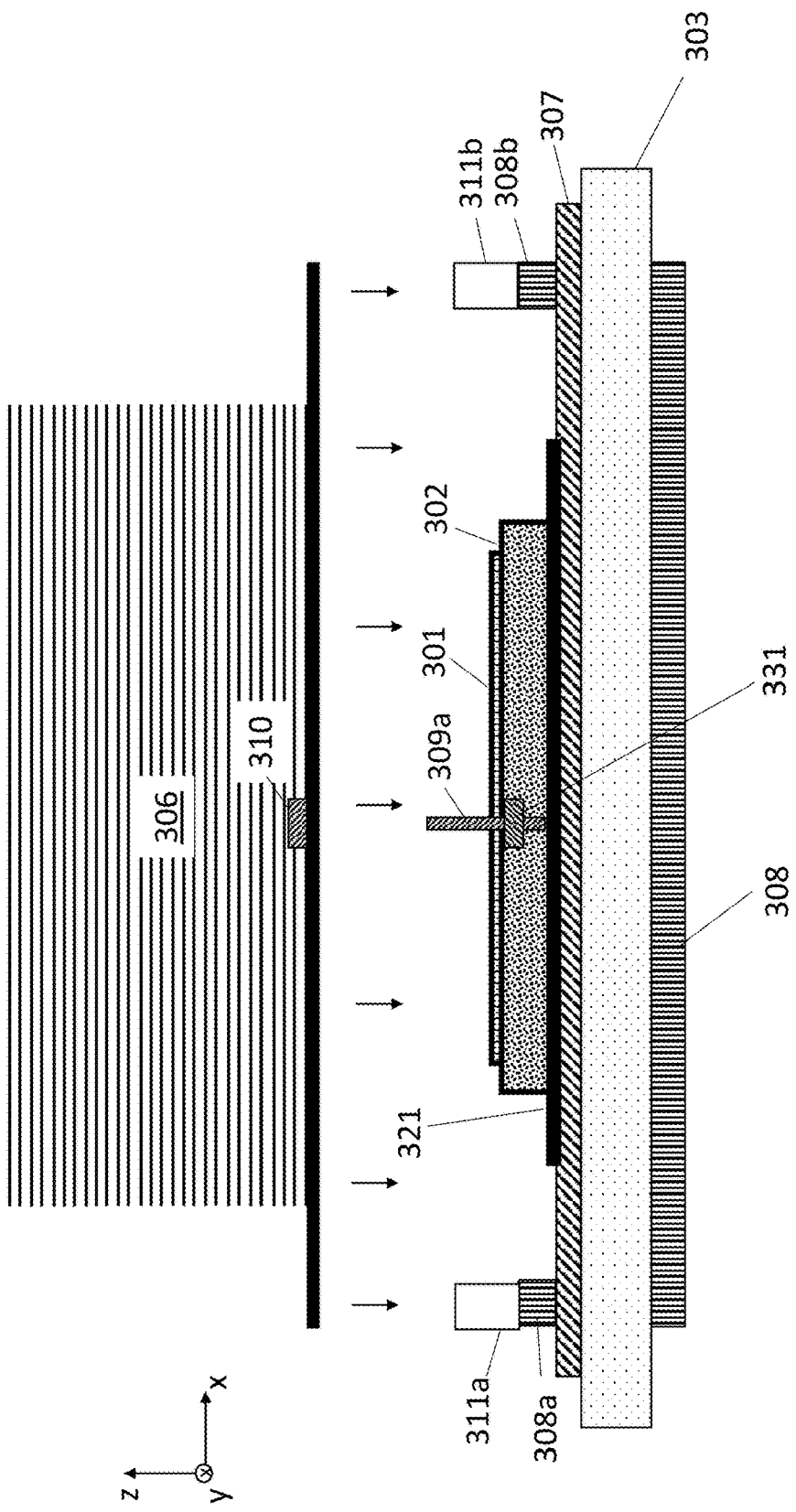

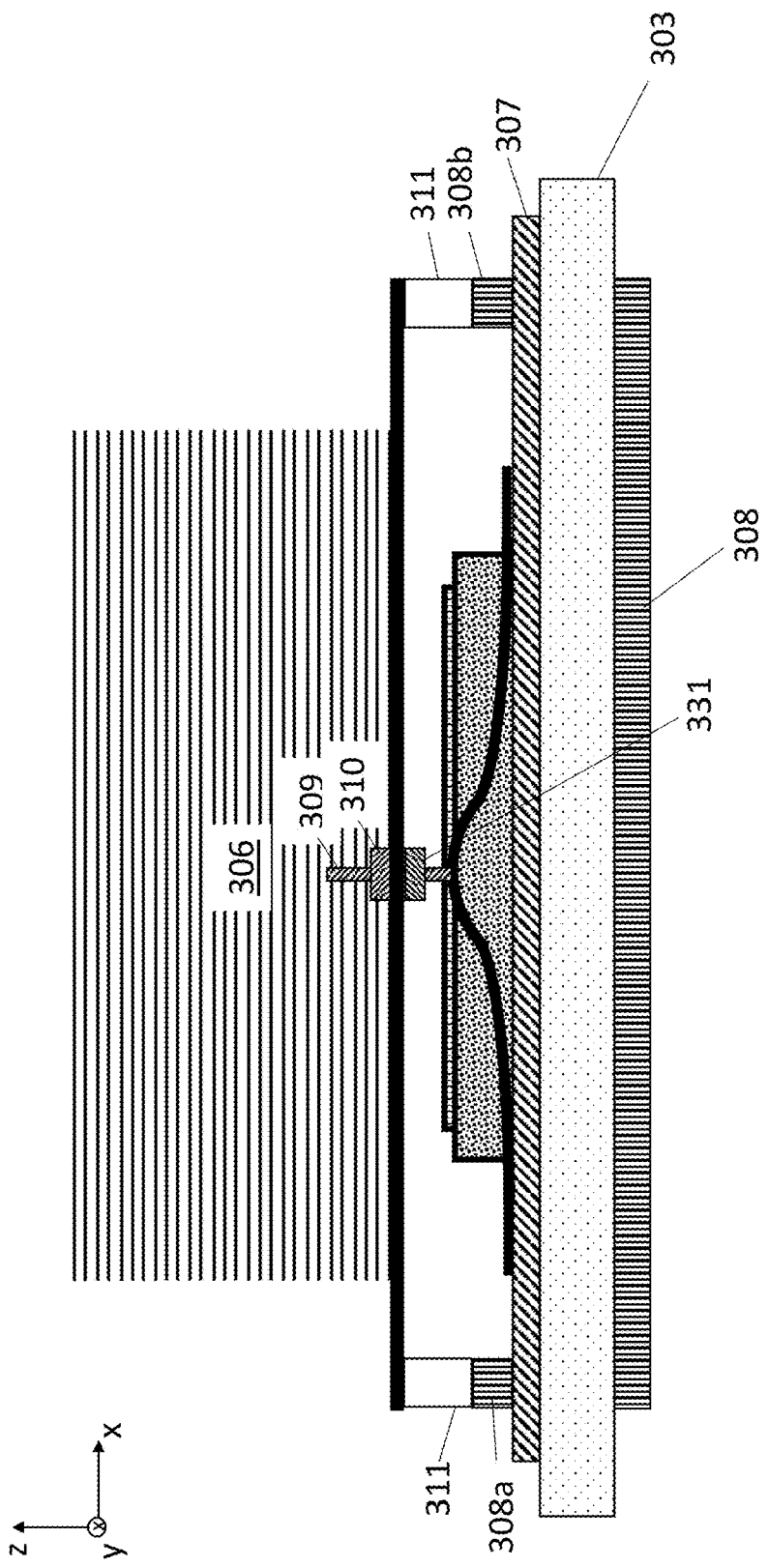

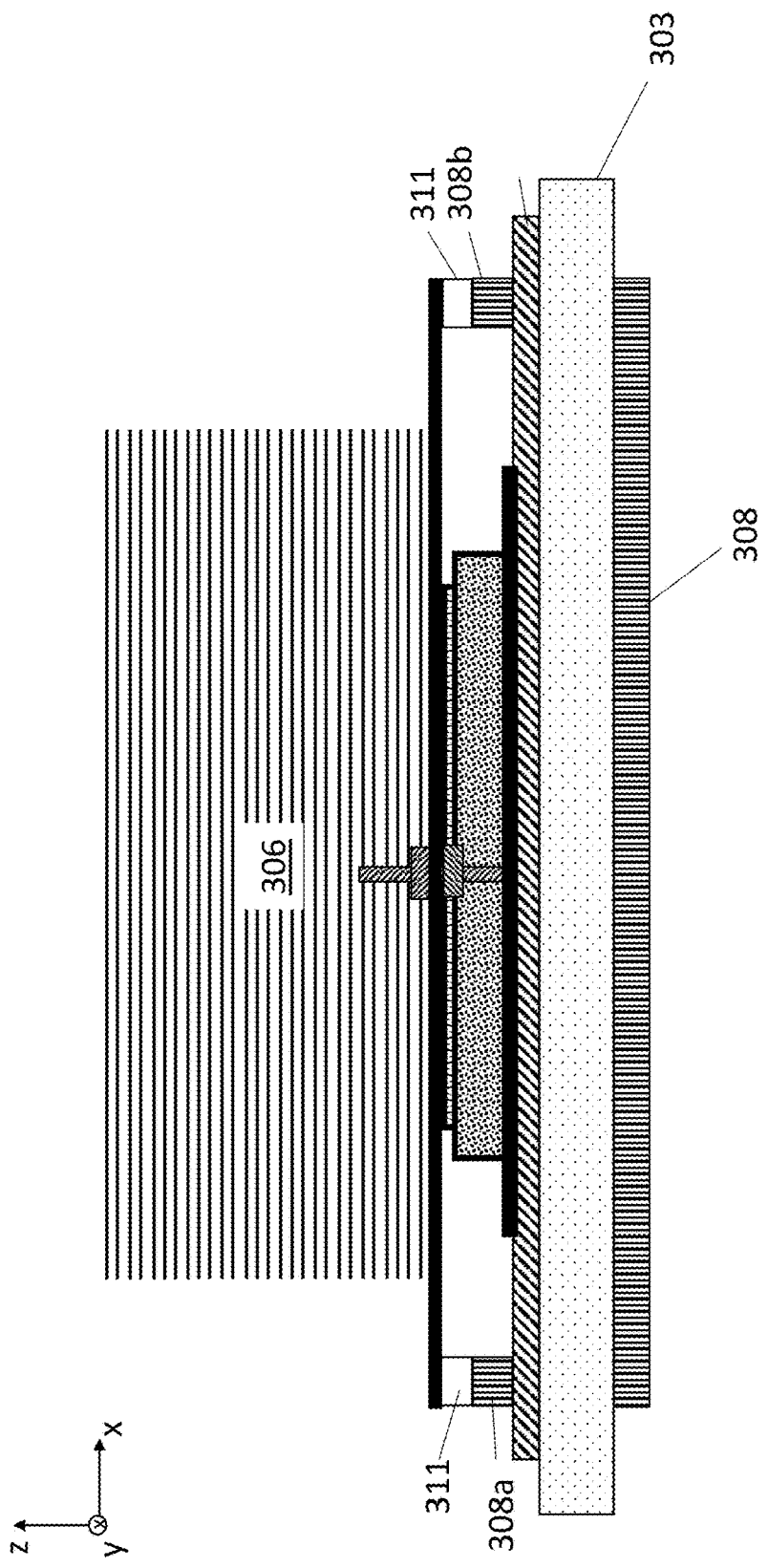

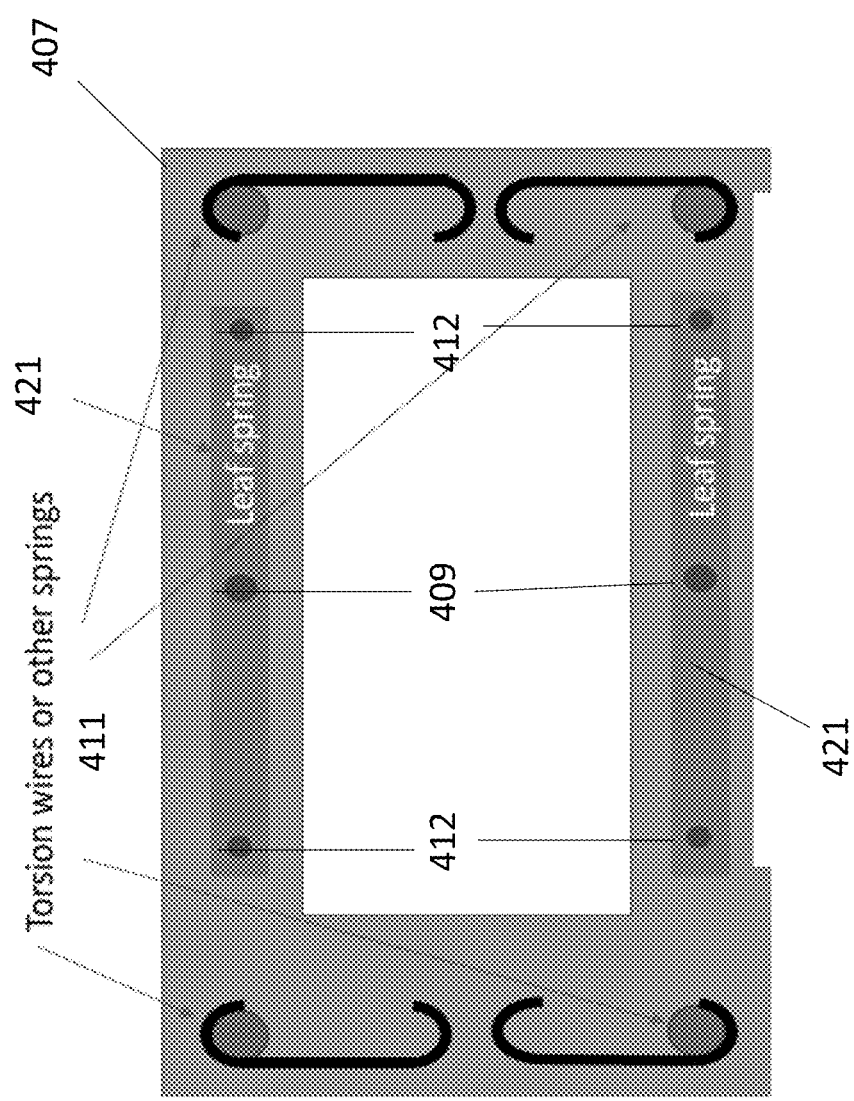

COOLING ASSEMBLY WITH STRAP ELEMENT TO DIMINISH LATERAL MOVEMENT OF COOLING MASS DURING INSTALLATION OF THE COOLING MASS

BACKGROUND

System design engineers face challenges, especially with respect to high performance data center computing, as both computers and networks continue to pack higher and higher levels of performance into smaller and smaller packages. Creative packaging solutions are therefore being designed to keep pace with the thermal requirements of such aggressively designed systems.

FIGURES

FIGS. 1a and 1b show a land grid array (LGA) chip package being inserted into an LGA socket;

FIGS. 2a, 2b and 2c show installation of cooling mass to a bolster plate having a strap element;

FIGS. 3a, 3b, 3c, 3d, 3e, 3f, 3g, 3h and 3i depict installation of cooling assembly having a bolster plate with a strap element;

FIGS. 4a and 4b show top down views of different bolster plates having strap elements;

DETAILED DESCRIPTION

Figure 3A:
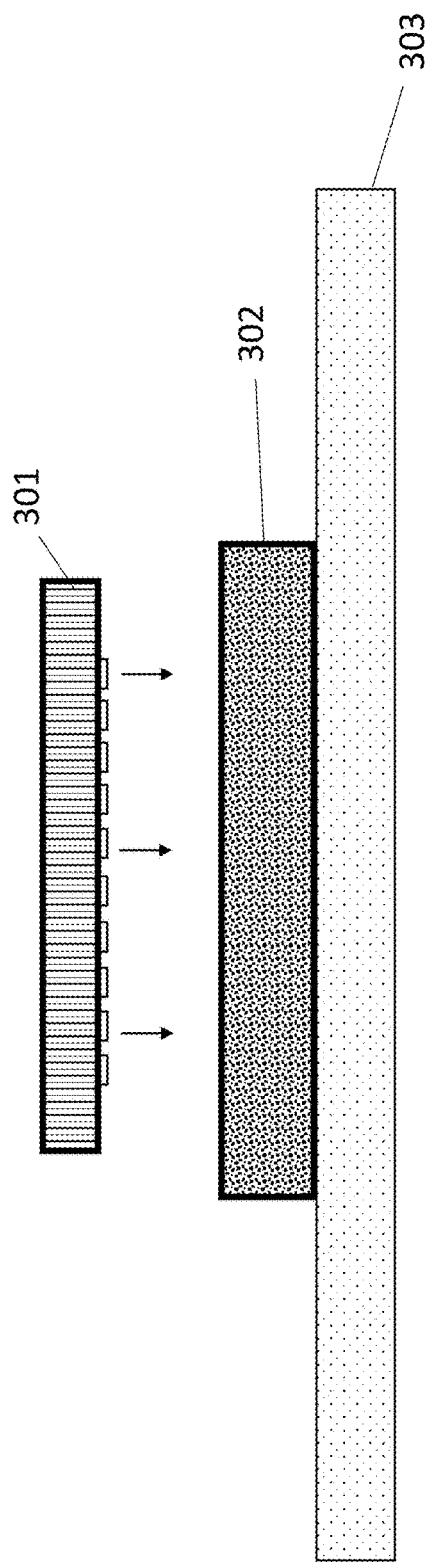

FIGS. 1a and 1b depict the mounting of a heat sink 106 to a land grid array (LGA) semiconductor chip package 101. The LGA chip package 201 is inserted into an LGA socket 102. The LGA socket 102 is mounted to a printed circuit board 103 by way of solder ball input/output (I/O) connections (not shown in FIG. 1a for illustrative ease). Metal, spring-like I/O fingers 104 reside on the floor of the socket cavity (FIG. 1a shows a cross section of the socket 102 so that the cavity floor is observed). The I/O fingers 104 are aligned with corresponding pad I/Os 105 on the underside of the chip package 101.

Unfortunately, when the heat sink 106 is mounted to its support hardware 107 and is pressed into the chip package 101, the heat sink 106 is prone to lateral movement (movement in the x-y plane) which, in turn, causes lateral movement of the chip package 101 within the socket 102. The lateral movement of the chip package 101 within the socket 102 can damage the I/Os 104, 105 between the package 101 and socket 102.

The lateral movement of the heat sink 106 is a consequence of the heat sink's large mass. Here, the heat sink 106 has large mass so that large amounts of heat generated by the chip(s) within the chip package 101 can be dissipated through the heat sink 106. A large mass, having higher momentum, tends to maintain any imparted movement. Thus, the heat sink 106 tends to maintain any lateral movement that is imparted to it while it is being mounted to its support hardware 107.

FIGS. 2a through 2c depict a solution that integrates a leaf spring 221 with the heat sink's support hardware to diminish such lateral movement of the heat sink 206.

FIG. 2a shows a side view where the side of the socket 202 is observed (rather than a cross section of the socket). As such, with the chip package 201 inserted within the socket 202, only the lid of the chip package 201 is observable. A bolster plate 207 is tightly secured to a back plate 208 with the printed circuit board 203 in between. As will be made more clear further below, the bolster plate 207 is a frame like structure having a window opening within which the socket 202 is placed. As observed in FIG. 2a, the ends 212 of the leaf spring 221 are riveted to the bolster plate 207.

FIG. 2b depicts the structure after the heat sink 206 has been initially placed on the mounting hardware 211 before the mounting hardware 211 is tightened to secure the heat sink 206 to the bolster plate 207 (as observed in FIG. 2b, the mounting hardware 211 emanates from the bolster plate 207). Additionally, a threaded bolt 209 that emanates from a middle region of the leaf spring 221 is aligned with an inserted into a hole in the base of the heat sink 206. The bolt 209 is fit into nut 210 that is mechanically integrated with the hole.

The nut 210 is rotated which threads the bolt 209 through nut 210 and pulls the bolt 209 upward in the +z direction. Notably, the bolt 209 has a stopping element 231 such as a nut that is welded or brazed to the bolt 209 a certain distance along the shaft of the bolt 209 (the stopping element's position along the shaft of the bolt 209 is fixed). The upward movement of the bolt 209 pulls the middle region of the leaf spring 221 toward the base of the heat sink 206 while the ends of the leaf spring 221 remain riveted to the bolster plate 207 (a corresponding leaf spring, bolt and nut also exist on the opposite side of the heat sink 206 and are engaged as observed in FIG. 2b). The bolt 209 pulls upward with continuous threading through nut 210 until the stopping element 231 presses against the underside of the base of the heat sink 206 which sets a bend or bow in the leaf spring 221.

With the leaf spring 221 now being mechanically integrated with the heat sink 206 via bolt 209, lateral movement of the heat sink 206 becomes difficult if not impossible. Here, the leaf spring 221 acts as a strap that straps the heat sink 206 in place in the x-y plane (the leaf spring 221 can therefore be viewed as a type of strap element). Additionally, with the heat sink 206 being placed upon its mounting hardware 211, the heat sink 206 will exhibit little if any tilt.

FIG. 2c shows the structure after the heat sink's mounting hardware 211 has been tightened. The tightening of the mounting hardware 211 compresses the mounting hardware 211 with a high loading force that, in turn, lowers the heat sink 206 onto the lid of the chip package 201 and presses the chip package 201 deeper into the socket cavity 202. As observed in FIG. 2c, the lowering of the heat sink 206 flattens the leaf spring 221 (the bow in the leaf spring 221 observed in FIG. 2b is removed). In other embodiments, the leaf spring 221 may retain some of its bowing when the tightening of the mounting hardware 211 is complete. With some retained bowing in the leaf spring 221, the leaf spring 211 will apply a loading force that draws the heat sink 206 into the chip package lid.

In various embodiments the mounting hardware 211 is spring-loaded such that the more the hardware 211 is tightened, the more the bottom face of the heat sink 106 is forcibly driven into the lid of the chip package 201. The leaf spring 221, if bowed as described just above, can also add to such spring loading.

Notably, owing to the strap effect of the leaf springs 221, the heat sink 206 exhibits very little (if any) movement in the x and/or y directions while it is being lowered during the tightening of the mounting hardware 211. Moreover, the mounting hardware 211 tends to minimize tilt of the heat sink 206 (the bottom face of the heat sink 206 presses flush against the lid of the package 201). As such, the chip package 201 is uniformly pressed into the socket 202 with little any tilt Thus, the combination of the leaf spring straps 221 and the mounting hardware 211 results in flush, even movement of the heat sink in the −z direction during its installation which, in turn, diminishes if not eliminates any I/O damage between the chip package 201 and socket 202 during installation of the heat sink 206.

FIGS. 3*a* through 3*i* show an embodiment of the formation of a complete cooling assembly having leaf spring straps to diminish heat sink lateral movement during installation as described just above.

Figure 3B:
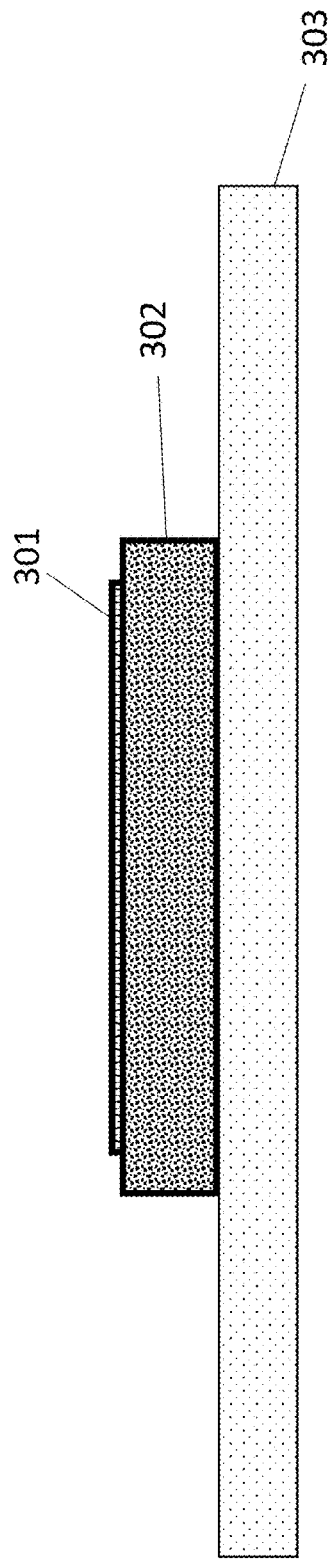

As observed in FIGS. 3*a* and 3*b*, a packaged semiconductor chip 301 (or chips) is plugged into a socket 302 that is affixed to an electronic circuit board 303. Upon being plugged into the socket 302, the chip package 301 is mechanically and electrically coupled to the printed circuit board 303 through I/O connections that exist between the socket 302 and the chip package 301.

Figure 3C:
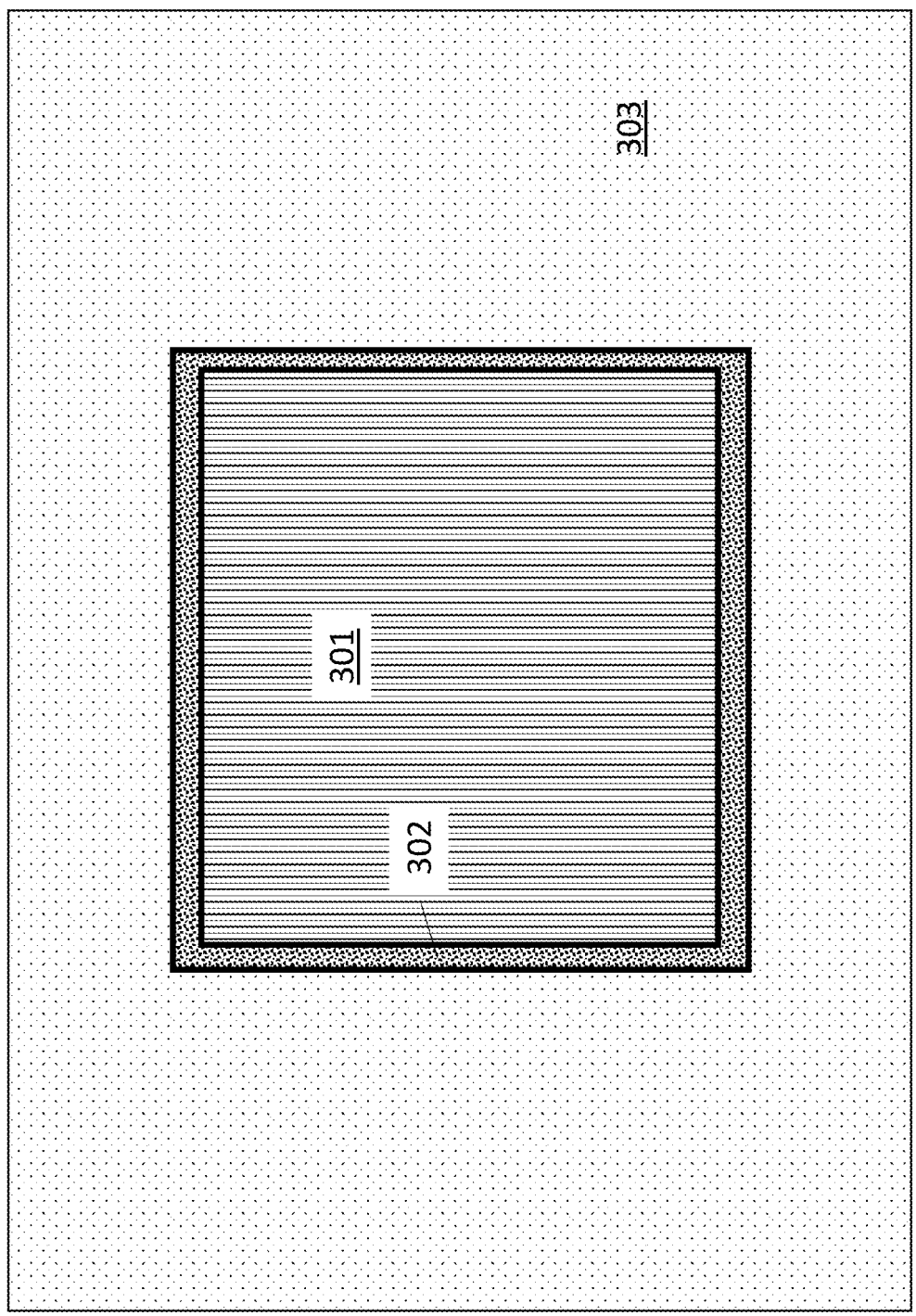
Figure 3D:
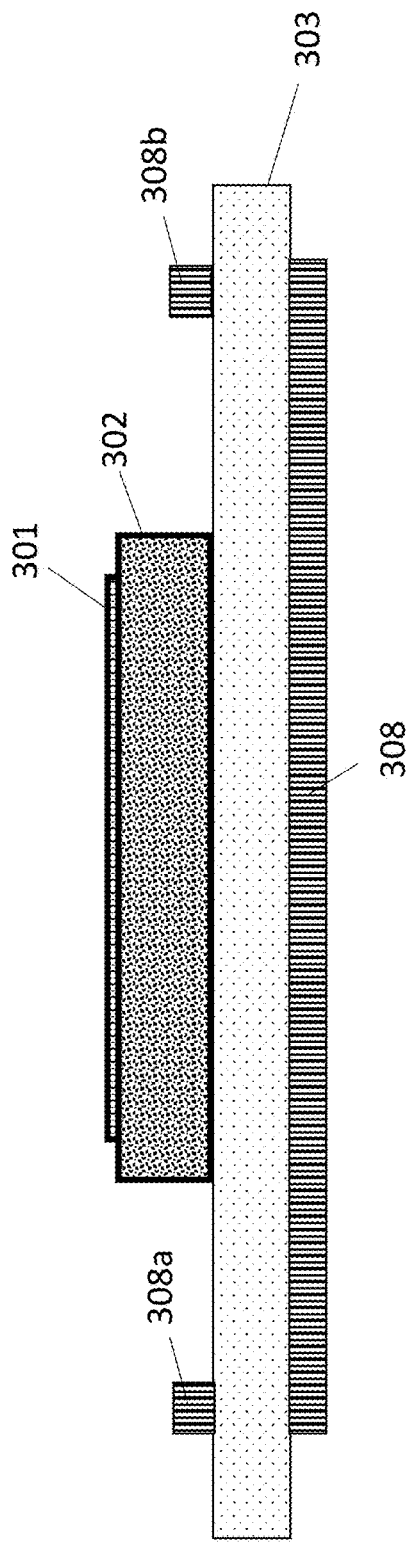

FIG. 3*c* shows a top down view of the structure in FIG. 3*b*. As observed in FIG. 3*d*, a backing plate 308 is placed on the back side of the circuit board 303. Studs 308*a*, 308 that emanate from the backing plate 308 are inserted through corresponding holes on the printed circuit board 303.

Figure 3E:
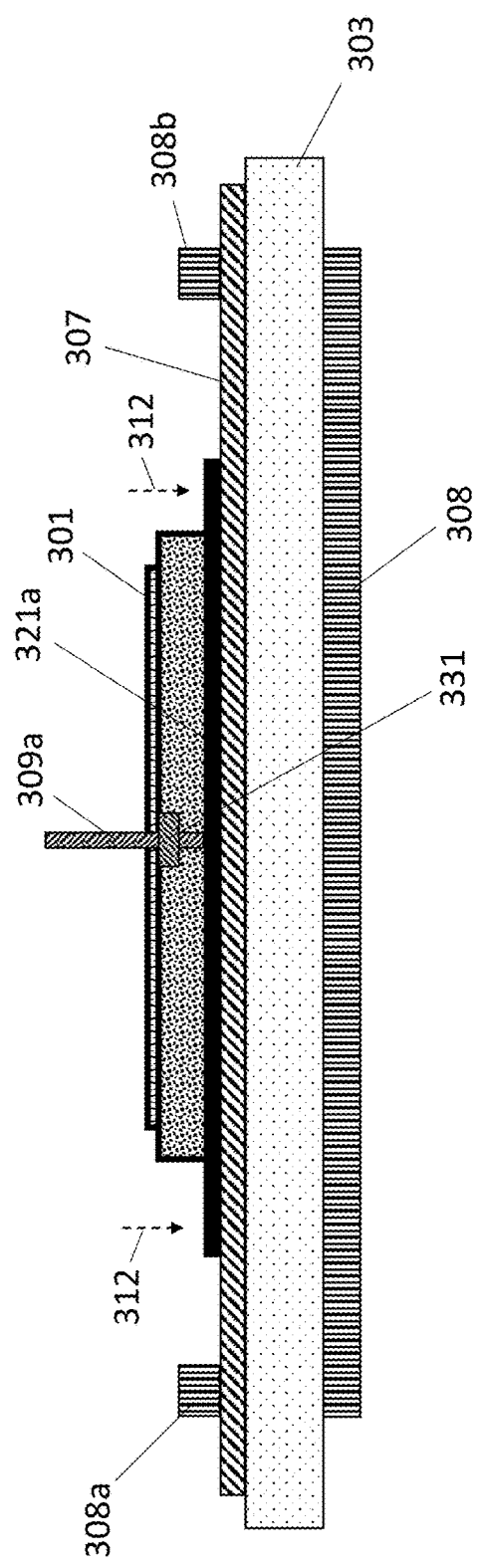

As observed in FIG. 3*e*, a bolster plate 307 having leaf spring straps 321 is placed on the chip package side of the electronic circuit board 303 (only one leaf spring strap 321*a* is observable in the side view of FIG. 3*e*). As discussed above, the leaf spring straps 321 are riveted near their far ends 312 to the bolster plate 307 and have a bolt 309 that emanates upward from their middle region and has a stopping element 331 fixed at a set distance along the shaft of the bolt 309.

Figure 3F:
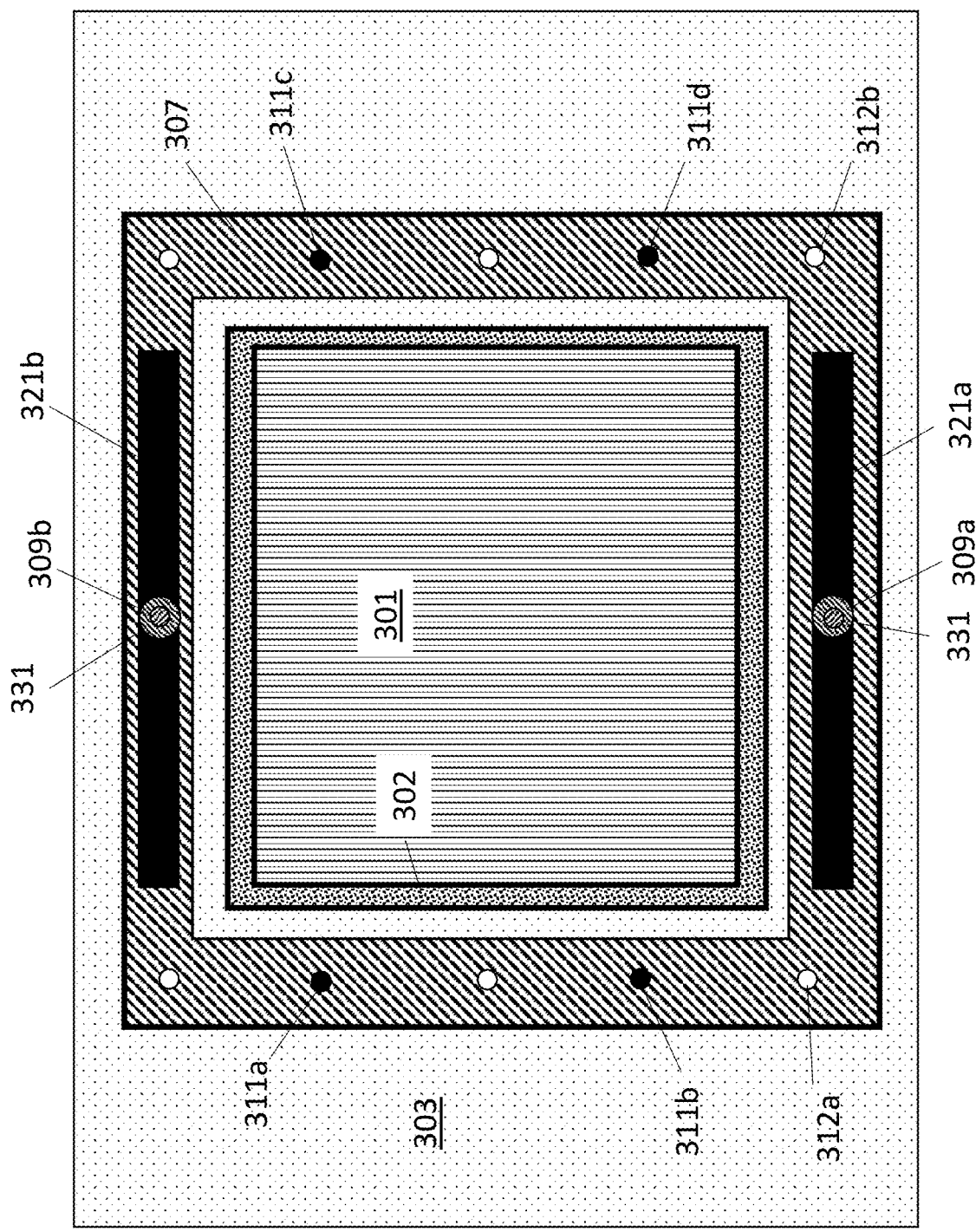

A top down view of the structure of FIG. 3*e* is observed in FIG. 3*f*. As can be seen in FIG. 3*f*, the bolster plate 307 is a frame-like structure with the socket 302 and chip package 301 located in the window opening of the frame. The leaf spring straps 321*a,b* with their respective upward emanating bolts 309*a,b* are fixed to the bolster plate 307 and located in front of and behind the socket 302.

The back plate studs 308*a*, 308*b* are aligned with corresponding holes in the bolster plate 307. Specifically, studs 308*a* and 308*b* of FIG. 3*e* are aligned with holes 312*a* and 312*b* of FIG. 3*f*. For ease of drawing, only holes 312*a* and 312*b* of FIG. 3*f* are labeled because only studs 308*a* and 308*b* are observable from the side view of FIG. 3*e*. However, as suggested by FIG. 3*f*, similar studs and aligned holes exist around the periphery of the socket 302.

The studs 308*a,b* are rigidly secured to the bolster plate 307 with fixturing elements (not show) which compress the circuit board 303 between the bolster plate 307 and backing plate 308 thereby adding structural support to the circuit board 303 in the vicinity of the socket 302 where the weight of the heat sink will be borne.

Then, as observed in FIG. 3*g*, a heat sink 306 is aligned with and placed upon heat sink fixturing elements 311 of the bolster plate 307. Referring back to FIG. 3*f*, the bolster plate 307 also includes additional heat sink fixturing elements 311*a,b,c,d* (e.g., studs, mounts, holes, receptors, bolts, screws, pins, levered latches, springs, torsion bars, etc.) that are used to securely mount the base of the heat sink base 306 to the bolster plate 307 with high loading force that pulls the base of the heat sink 306 and the bolster plate 307 toward one another (e.g., fixturing elements 311*a,b,c,d* correspond to torsion bars and associated hardware as described below with respect to FIGS. 4*a* and 4*b*). The bottom of the heat sink base has corresponding mechanical features to interface with the fixturing elements 311.

Before mounting the base of the heat sink 306 to the bolster plate 307, however, as observed in FIG. 3*h*, the threaded bolts 309 that emanate from the leaf springs 321*a,b* are inserted into holes in the heat sink base and threaded into nuts 310 that are mechanically integrated with the heat sink base (in alternate embodiments, fixturing elements other than a nut and bolt can be used (e.g., levered latches)). Only the front facing bolt 309 and nut is observed in FIG. 3*g*.

As the nut 310 is turned the bolt 309 feeds upward through the nut 310 and a middle section of the leaf spring 321 is pulled up toward the heat sink base as observed in FIG. 3*h*. In an embodiment, the bolt 309 is located in a hole in the leaf spring 321 and has a wide pan head. When the nut 310 is turned and draws the bolt 309 upward, the pan head pulls the middle of leaf spring upward. After a sufficient number of turns of the bolt 310, the upward movement of the bolt 310 will be stopped by the stopping element 331 which sets the bowing of the leaf spring 321 and a corresponding designed for loading force that draws the heat sink toward the bolster plate 307 thereby strapping the heat sink 306 to the bolster plate 307.

With the heat sink 306 being strapped to the bolster plate 312, the heat sink 306 will exhibit little (if any) movement in the xy plane. Furthermore, with the heat sink 306 resting on fixturing elements 311, the heat sink 306 will exhibit little (if any) tilt.

As observed in FIG. 3*i*, after the heat sink 306 has been strapped to the bolster plate 307 with the leaf springs 321, the heat sink base is secured to the bolster plate 307 with high loading force by tightening the fixturing elements 311. In various embodiments, the fixturing elements 311 couple some kind of spring-loaded attachment (e.g., torsion bar) between the bolster plate 307 and the heat sink 306 to keep the heat sink 306 in thermal contact with the semiconductor chip package 301 while supporting the weight of the heat sink 306 through the bolster plate 307.

More specifically, in various embodiments, the fixturing elements 311 include some kind of spring-like mechanical element (spring element) that is compressed or stretched (depending on the particular mechanical design) as the heat sink 306 is being mounted to the bolster plate 307. Here, the term "spring element" can mean an actual spring (e.g., a coil spring) or other mechanical element designed to provide elastic resistance to some kind of movement (e.g., metal tab, metal finger, leaf spring, torsion bar, etc.).

The loading force created by the compressing/stretching of the spring elements pulls the bottom of the heat sink 306 and the top of the bolster plate 307 toward one another which acts to keep the heat sink 306 rigidly in place against the bolster plate 307. The same loading force overcomes "push-back" applied by the socket's finger like metal I/Os against the pad I/Os on the bottom of the chip package 301.

As the fixturing elements 311 are tightened (and the spring elements compressed/expanded), the heat sink 306 is lowered and presses the chip package 301 firmly into the socket 302. Importantly, because of the leaf spring strap 321, the heat sink 306 demonstrates little/no movement in the xy plane while it presses the chip package 301 into the socket 302 thereby diminishing I/O damage between the chip and socket I/Os. Likewise, the fixturing elements 311 diminish tilt of the heat sink 306 while the heat sink 306 is being pressed into the chip package 301 which further minimizes risk of I/O damage between the package 301 and socket 302.

As observed in FIG. 3i the leaf spring strap 321 is flattened in the final assembly. However, in other embodiments the leaf spring strap 321 may retain some bowing (e.g., owing to the setting of the stopping element 331) to induce additional loading force that pulls the heat sink and bolster plate toward one another.

Although the above embodiment described the spring element of the spring loaded fixturing mechanism as being a feature of the fixturing elements 311 that are integrated with the bolter plate 307, in other embodiments the spring element of the spring loaded fixturing mechanism (e.g., torsion bar) is integrated with the base of the heat sink 306.

Even in such embodiments where the spring element of the spring loaded fixturing mechanism (e.g., torsion bar) is integrated with the base of the heat sink, the bolster plate 307 would nevertheless include fixturing elements 311 to mate with, couple to, or otherwise assist the spring loaded mechanical coupling between the heat sink and the bolster plate (e.g., a floor for a spring mechanism to press upon, a threaded hole for a spring loaded bolt to be threaded into, etc.). Thus fixturing elements 311 should be understood to be mechanical features that help effect the spring loading between the heat sink and the bolster plate but need not include the actual spring element itself.

FIG. 4a shows a more detailed embodiment of a bolster plate having leaf springs 421 along a longer dimension of the bolster plate's window opening and fixturing elements (torsion springs) along a shorter dimension of the bolster plate's window opening. The rivets 412 that secure the leaf springs 421 to the bolster plate 407 and the bolts 409 that emanate from the leaf spring are also observable.

Figure 4B:
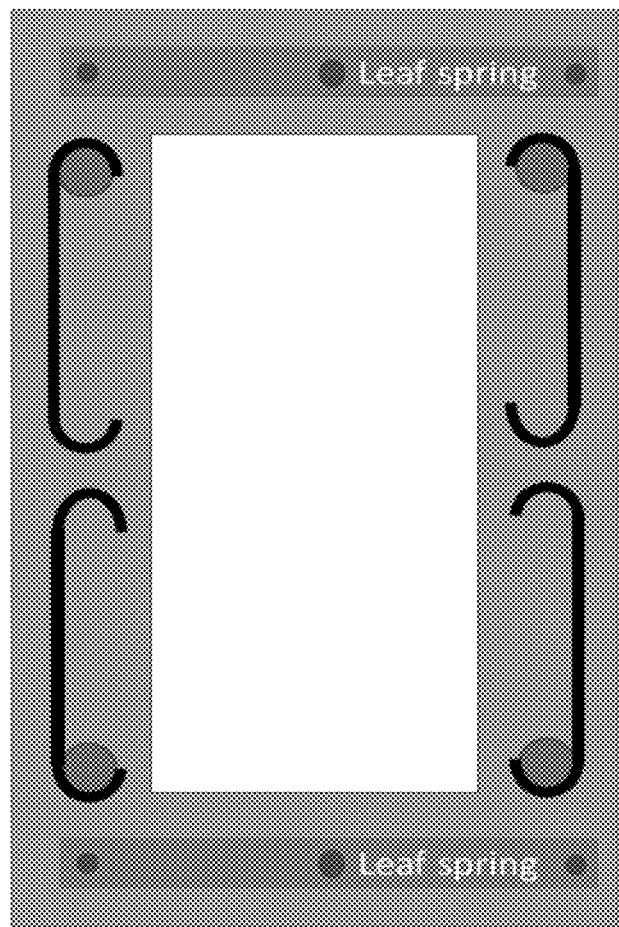

FIG. 4b shows a similar bolster plate but where the leaf springs are located along the shorter dimension of the window and the fixturing elements are located along the longer dimension of the window. FIGS. 4a and 4b demonstrate that in various embodiments the strap elements are located along opposite arms of the frame ("frame arms") formed by the bolster plate. Other embodiments can choose to put the strap elements along neighboring, orthogonal frame arms.

Although embodiments above have been directed to air cooled cooling assemblies having a heat sink, other embodiments may use liquid cooling of some kind in which the heat sink is replaced by a cold plate (through which cooled liquid flows) or a vapor chamber (within which liquid transfers from liquid phase to vapor phase). Any of a heat sink, cold plate or vapor chamber can be referred to more generally as a cooling mass.

Figure 5:
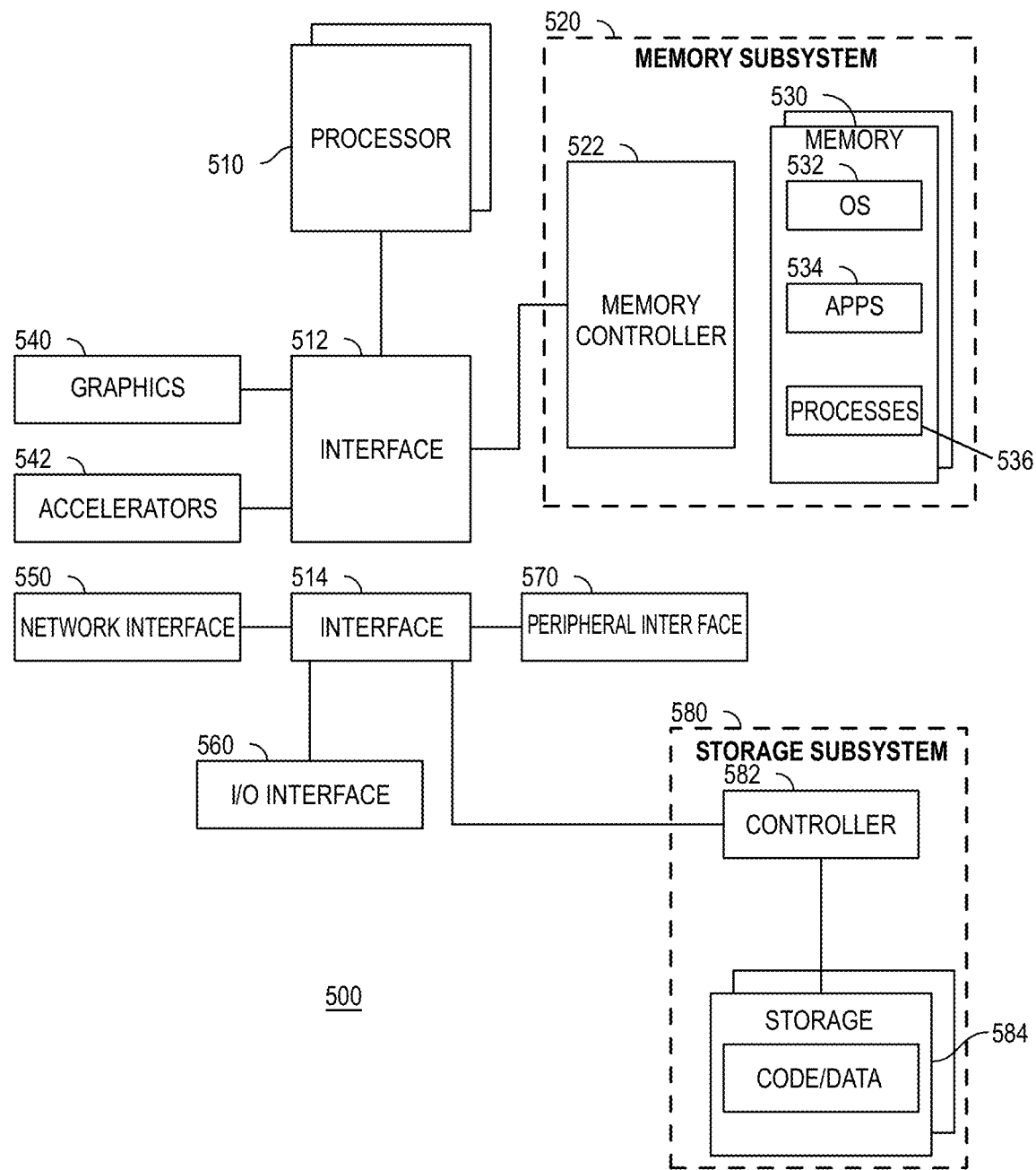
FIG. 5 shows an electronic system.
Figure 6:
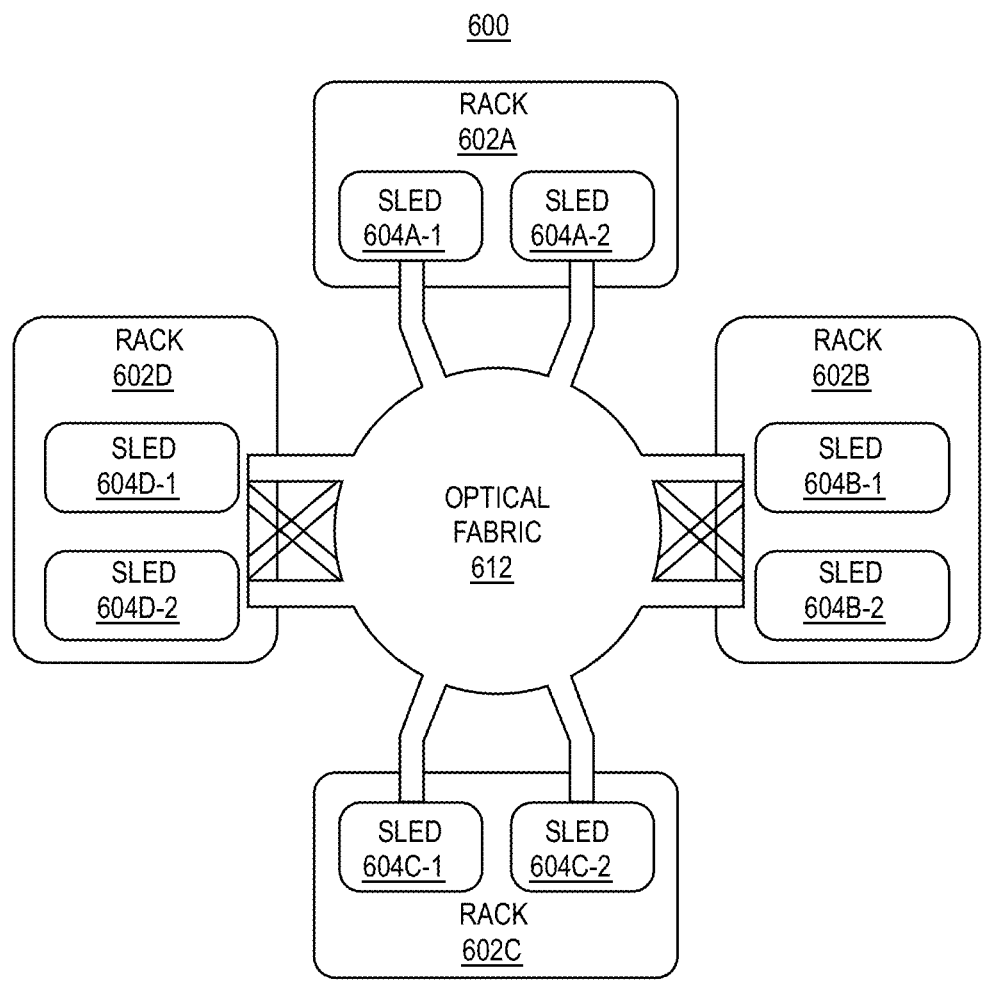
FIG. 6 shows a data center.
Figure 7:
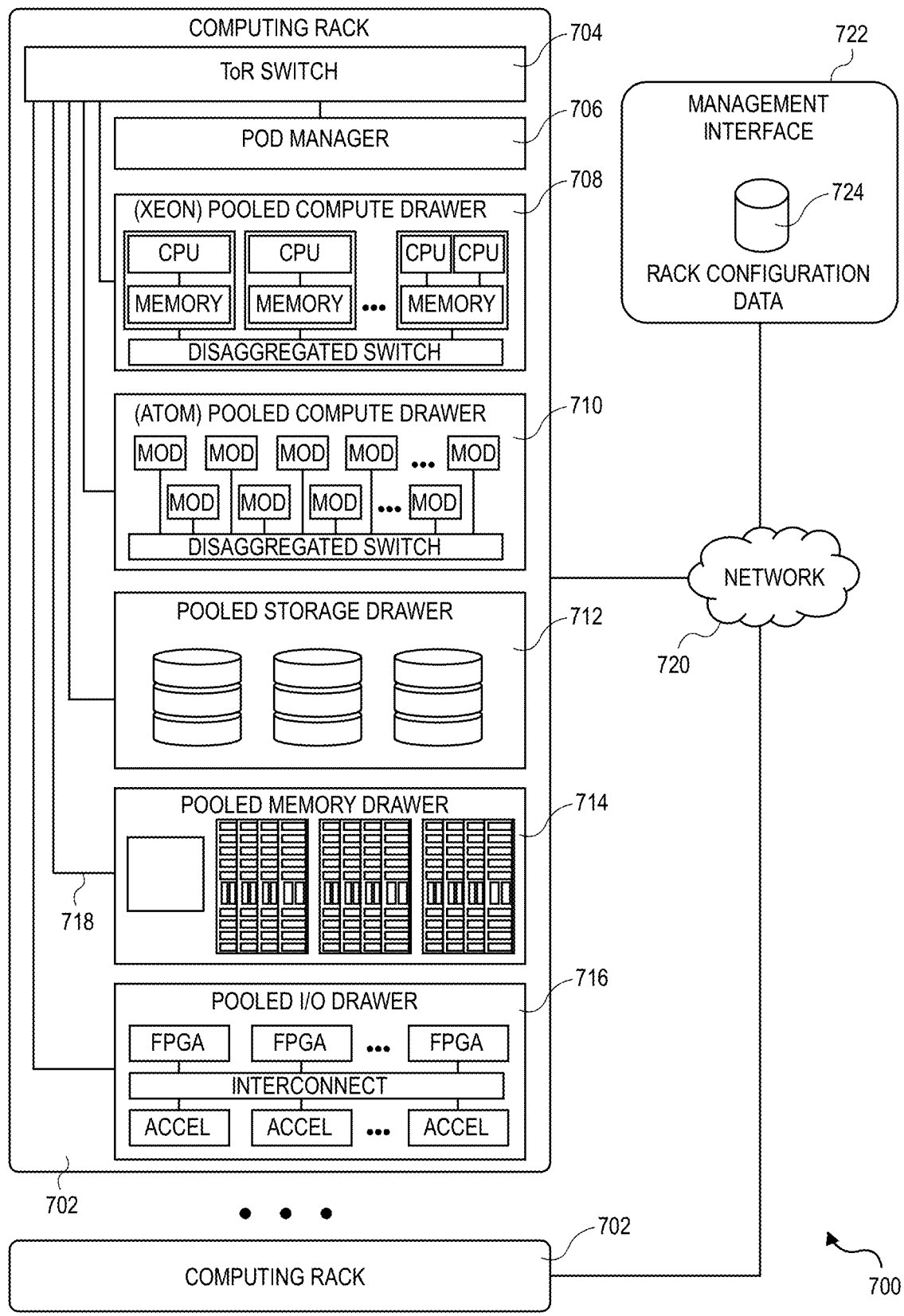
FIG. 7 shows a rack.

The following discussion concerning FIGS. 5, 6 and 7 are directed to systems, data centers and rack implementations, generally. FIG. 5 generally describes possible features of an electronic system that can include one or more semiconductor chip packages having a cooling assembly that is designed according to the teachings above. FIG. 6 describes possible features of a data center that can include such electronic systems. FIG. 7 describes possible features of a rack having one or more such electronic systems installed into it.

FIG. 5 depicts an example system. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU). For example, accelerators 542 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 542 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, volatile memory, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software functionality to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 500 includes interface 514, which can be coupled to interface 512. In one example, interface 514 represents an interface circuit, which can include standalone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data in a persistent state (e.g., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (e.g., the value or state of the data is indeterminate if power is interrupted to system 500). In one example, storage subsystem 580 includes controller 582 to interface with storage 584. In one example controller 582 is a physical part of interface 514 or processor 510 or can include circuits in both processor 510 and interface 514.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Such non-volatile memory devices can be placed on a DIMM and cooled according to the teachings above.

A power source (not depicted) provides power to the components of system 500. More specifically, power source typically interfaces to one or multiple power supplies in system 500 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented as a disaggregated computing system. For example, the system 500 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 5, other types of systems to which the above described invention can be applied and are also partially or wholly described by FIG. 5 are communication systems such as routers, switches and base stations.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. However, optical, wireless, and/or electrical signals can be transmitted using fabric 612. The signaling connectivity that optical fabric 612 provides to any given sled may include connectivity both to other sleds in a same rack and sleds in other racks.

Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

FIG. 7 depicts an environment 700 that includes multiple computing racks 702, each including a Top of Rack (ToR) switch 704, a pod manager 706, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 708, and INTEL® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as a 40 Gigabit/second (Gb/s) or 100 Gb/s Ethernet link or an 100+Gb/s Silicon Photonics (SiPh) optical link. In one embodiment high-speed link 718 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 700 may be interconnected via their ToR switches 704 (e.g., to a pod-level switch or data center switch), as illustrated by connections to a network 720. In some embodiments, groups of computing racks 702 are managed as separate pods via pod manager(s) 706. In one embodiment, a single pod manager is used to manage all of the racks in the pod. Alternatively, distributed pod managers may be used for pod management operations. RSD environment 700 further includes a management interface 722 that is used to manage various aspects of the RSD environment. This includes managing rack configuration, with corresponding parameters stored as rack configuration data 724.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.".

The invention claimed is:

1. An apparatus, comprising:
  a bolster plate including:
    a first fixturing element; and
    a strap, the strap positioned along a frame arm of the bolster plate, the strap including a second fixturing element to be fixed to a cooling mass, the strap to diminish movement of the cooling mass along a first dimension along a length of the frame arm and a second dimension that is orthogonal to the first dimension, a semiconductor chip package to be placed in a window opening defined by the bolster plate's frame arms, the cooling mass to be thermally coupled to the semiconductor chip package;
  a first fastener to couple a first end of the strap to the bolster plate; and
  a second fastener to couple a second end of the strap to the bolster plate.

2. The apparatus of claim 1 wherein the first fixturing element is spring loaded.

3. The apparatus of claim 2 wherein the second fixturing element is a bolt that emanates from the strap.

4. The apparatus of claim 3 wherein the bolt is to be threaded through a nut that is mechanically integrated with the cooling mass.

5. The apparatus of claim 1 wherein the strap is to be bowed when the strap is secured to the cooling mass with the second fixturing element and the cooling mass is not yet secured to the bolster plate with the first fixturing element.

6. The apparatus of claim 1 wherein the bolster plate includes:
  a third fixturing element and a second strap, the second strap positioned along another frame arm of the bolster plate, the second strap including a fourth fixturing element to be fixed to the cooling mass, the second strap to diminish movement of the cooling mass along the first dimension and the second dimension.

7. The apparatus of claim 1 wherein the frame arm is a first frame arm and the window is defined in part by the first frame arm and a second frame arm which is opposite the frame arm across the window.

8. The apparatus of claim 5 wherein the strap is to be flat when the strap is secured to the cooling mass with the second fixturing element and the cooling mass is secured to the bolster plate with the first fixturing element.

9. A cooling assembly, comprising:
  a cooling mass;
  a nut directly coupled to the cooling mass;
  a bolster plate, the bolster plate including:
    a first fixturing element; and
    a strap, the strap positioned along a frame arm of the bolster plate, the strap including a second fixturing element to be coupled to the nut, the strap to diminish movement of the cooling mass along a first dimension along a length of the frame arm and a second dimension that is orthogonal to the first dimension;
  a stopping element coupled to the second fixturing element, the stopping element to abut the cooling mass; and
  a back plate, the bolster plate having additional fixturing elements to secure the bolster plate to the back plate with a printed circuit between the back plate and the bolster plate.

10. The cooling assembly of claim 9 wherein the first fixturing element is spring loaded.

11. The cooling assembly of claim 10 wherein the second fixturing element is a bolt that emanates from the strap.

12. The cooling assembly of claim 9 wherein the strap is to be bowed when the strap is secured to the cooling mass with the second fixturing element and the cooling mass is not yet secured to the bolster plate with the first fixturing element.

13. The cooling assembly of claim 9 wherein the bolster plate includes:
  a third fixturing element and a second strap, the second strap positioned along another frame arm of the bolster plate, the second strap including a fourth fixturing element to be fixed to the cooling mass, the second strap to diminish movement of the cooling mass along the first dimension and the second dimension.

14. The cooling assembly of claim 9 wherein the frame arm is a first frame arm and the bolster plate includes a window that is defined in part by the frame arm and a second frame arm which is opposite the frame arm across the window.

15. The cooling assembly of claim 9 wherein the cooling mass is a heat sink.

16. A data center, comprising:
  a plurality of racks;
  a plurality of electronic systems installed into the plurality of racks, the plurality of electronic systems communicatively coupled via one or more networks;
  an assembly including:
    a bolster plate;
    a cooling mass;
    a semiconductor chip package within one of the electronic systems, the semiconductor chip package in contact with the cooling mass, the semiconductor chip package located within a window of the bolster plate, the bolster plate including:
      a first fixturing element; and
      a strap, the strap positioned along a frame arm of the bolster plate, the strap including a second fixturing element that is fixed to the cooling mass, the strap to diminish movement of the cooling mass along a first dimension along a length of the frame arm and a second dimension that is orthogonal to the first dimension; and
    a first fastener to couple a first end of the strap to the bolster plate; and
    a second fastener to couple a second end of the strap to the bolster plate.

17. The data center of claim 16 wherein the cooling mass is a heat sink.

18. The data center of claim 16 wherein the bolster plate includes:
  a third fixturing element and a second strap, the second strap positioned along another frame arm of the bolster plate, the second strap including a fourth fixturing element to be fixed to the cooling mass, the second strap to diminish movement of the cooling mass along the first dimension and the second dimension.

19. The data center of claim 18 wherein the frame arm is a first frame arm, the first frame arm is opposite a second frame arm across the window of the bolster plate.

20. The data center of claim 16 wherein the first fixturing element is spring loaded.

\* \* \* \* \*